United States Patent
Li

(10) Patent No.: US 9,673,776 B2
(45) Date of Patent: Jun. 6, 2017

(54) WIDE BAND DIRECTIONAL COUPLER

(71) Applicant: AIROHA TECHNOLOGY CORP., Hsinchu (TW)

(72) Inventor: Kuan-Wei Li, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 14/804,589

(22) Filed: Jul. 21, 2015

(65) Prior Publication Data

US 2016/0028363 A1    Jan. 28, 2016

Related U.S. Application Data

(60) Provisional application No. 62/027,300, filed on Jul. 22, 2014.

(51) Int. Cl.
| | |
|---|---|
| H01P 5/18 | (2006.01) |
| H03H 7/46 | (2006.01) |
| H01F 38/14 | (2006.01) |
| H04B 5/00 | (2006.01) |

(52) U.S. Cl.
CPC ............ H03H 7/468 (2013.01); H01F 38/14 (2013.01); H01P 5/187 (2013.01); H04B 5/0075 (2013.01)

(58) Field of Classification Search
CPC .................................. H01P 5/18; H01P 5/184
USPC ........................................... 333/109–112, 116
See application file for complete search history.

(56) References Cited

U.S. PATENT DOCUMENTS

| | | | | |
|---|---|---|---|---|
| 6,515,556 | B1 * | 2/2003 | Kato | H01P 5/185 333/116 |
| 7,305,223 | B2 * | 12/2007 | Liu | H01L 23/5227 257/528 |
| 8,358,179 | B2 * | 1/2013 | Frye | H01P 5/10 333/26 |
| 9,035,718 | B2 * | 5/2015 | Tamaru | H01P 5/187 333/109 |
| 2012/0319797 | A1 * | 12/2012 | Tamaru | H01P 5/184 333/112 |
| 2013/0300518 | A1 * | 11/2013 | Tamaru | H01P 5/18 333/109 |

* cited by examiner

*Primary Examiner* — Dean Takaoka
(74) *Attorney, Agent, or Firm* — Rosenberg, Klein & Lee

(57) ABSTRACT

A wide band directional coupler comprises a first transmission line, a second transmission line and at least one inductor, wherein the first transmission line and the second transmission line are adjacent each other, and the inductor connects to the second transmission. As a RF signal passes through the first transmission line, the second transmission line will couple with the RF signal in the first transmission line to generate a coupling signal. The inductor is connected to the second transmission line to improve the coupling factor and/or the insertion loss of the wide band directional coupler at high frequency band.

9 Claims, 4 Drawing Sheets

WIDE BAND DIRECTIONAL COUPLER

REFERENCE TO RELATED APPLICATIONS

This application is based on Provisional application Ser. No. 62/027,300, filed Jul. 22, 2014.

FIELD OF THE INVENTION

The present invention is related to a wide band directional coupler to improve the coupling factor and the insertion loss of the wide band directional coupler at high frequency band.

BACKGROUND

The directional coupler is widely used for a RF device. For instance, the directional coupler is disposed between an amplifier and an antenna. The directional coupler is able to monitor and measure the RF signal transmitted by the RF device, such as power of transmission or reflection of the RF signal, to adjust the output power of the RF signal according to the measurement result.

Generally, a power detector is connected to the directional coupler to detect a coupling signal of the directional coupler and calculate power of the RF signal passing through the directional coupler. However, the coupling factor and the insertion loss of the directional coupler depend on the frequency band of the RF signal. For instance, the coupling factor and the insertion loss of the directional coupler may increase at high frequency band to result in failure of the SPEC of the power detector.

SUMMARY

It is one object of the present invention to provide a wide band directional coupler. The wide band directional coupler has stable coupling factor and insertion loss at high and low frequency band, and meets the SPEC of most of power detectors.

It is one object of the present invention to provide a wide band directional coupler. The wide band directional coupler comprises a first transmission line, a second transmission line and at least one inductor. The first transmission line is adjacent the second transmission line, and the second transmission line is able to couple with the first transmission line. Further, the second transmission line is connected to the inductor to increase the impedance of the second transmission line at high frequency band, and improve the coupling factor and the insertion loss of the wide band directional coupler at high frequency band.

It is one object of the present invention to provide a wide band directional coupler. The wide band directional coupler comprises a first transmission line and a second transmission line. The first transmission line is adjacent the second transmission line, and the second transmission line is able to couple with the first transmission line. Further, the second transmission line is connected to at least one resistor to reduce the coupling ripple causing by variation of impedance of an antenna.

For achieving above objects, the present invention provides a wide band directional coupler, comprising: a first transmission line for transmitting a RF signal and comprising a first end and a second end; a second transmission line being adjacent the first transmission line and comprising a third end and a fourth end; and at least one inductor electrically connected between the third end and the fourth end, wherein when the RF signal passes through the first transmission line, the second transmission line couples with the RF signal in the first transmission line to generate a coupling signal.

In one embodiment of the wide band directional coupler, further comprises a first supporting unit and a second supporting unit, wherein the first supporting unit overlaps the second supporting unit, the first transmission line is disposed on the first supporting unit and a part of the second transmission line is disposed on the second supporting unit.

In one embodiment of the wide band directional coupler, the first transmission line comprises a first part and a second part, the first part is connected to the second part, the first part is S shape, and the second part is a straight line or a curve.

In one embodiment of the wide band directional coupler, the second transmission line comprises a third part and a fourth part, the third part is connected to the fourth part, the third part is S shape, and the fourth part is a straight line or a curve.

In one embodiment of the wide band directional coupler, the first part and the second part of the first transmission line respectively overlap the third part and the fourth part of the second transmission line.

In one embodiment of the wide band directional coupler, the first part and the second part of the first transmission line are similar with the third part and the fourth part of the second transmission line respectively.

In one embodiment of the wide band directional coupler, wherein the inductor is a spiral, a polygon spiral, an 8 shape spiral or a square spiral.

In one embodiment of the wide band directional coupler, the inductor comprises a fifth part disposed on the second supporting unit and a sixth part disposed on the first supporting unit, and the fifth part is connected to the sixth part.

In one embodiment of the wide band directional coupler, the first part and the second part of the first transmission line are disposed on the first supporting unit, and the third part and the fourth part of the second transmission line are disposed on the second supporting unit.

In one embodiment of the wide band directional coupler, the first transmission line overlaps the second transmission line.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which.

DETAILED DESCRIPTION OF THE PREFERRED EMBODIMENTS

Figure 1:
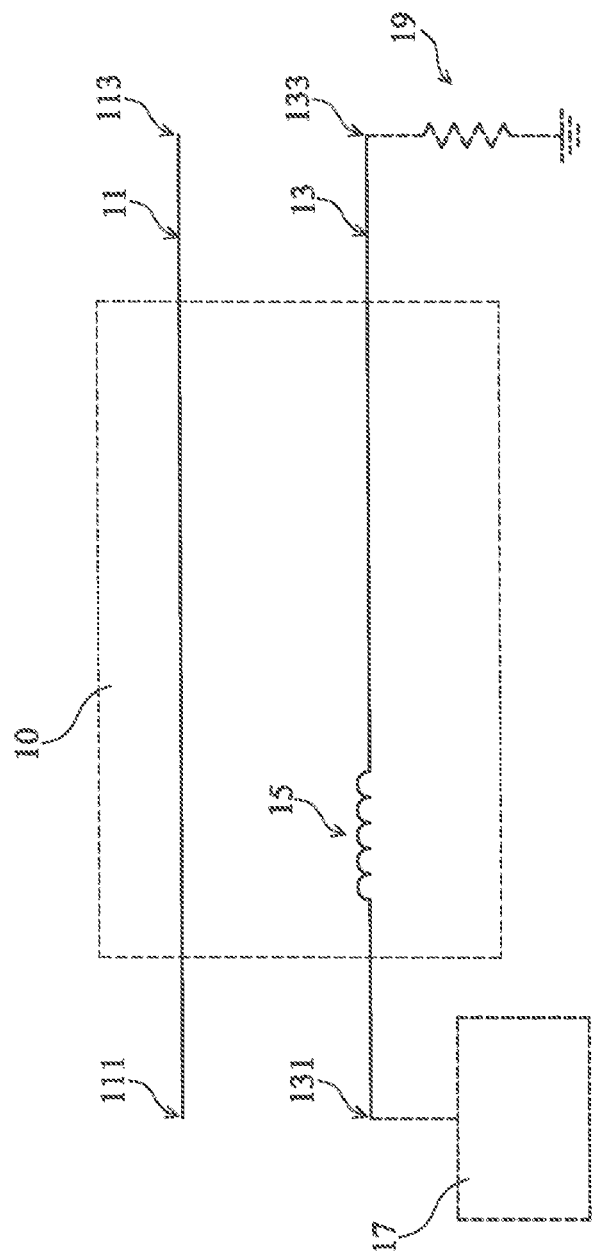
FIG. 1 is a circuit diagram of a wide band directional coupler according to the first embodiment of the present invention.

Referring to FIG. 1, there is shown a circuit diagram of a wide band directional coupler according to the first embodiment of the present invention. The wide band directional coupler 10 mainly comprises a first transmission line 11, a second transmission line 13 and at least one inductor 15, wherein the first transmission line 11 is adjacent the second transmission line 13, and the inductor 15 is electrically connected to the second transmission line 13.

In one embodiment of the invention, the first transmission line 11 may be defined as a main line for transmitting a RF signal. For example, the first transmission line 11 comprises a first end 111 and a second end 113, wherein the RF signal is inputted in the first end 111 of the first transmission lien 11, and outputted from the second end 113 the first transmission line 11.

The first transmission line 11 is adjacent the second transmission lien 13, and the second transmission line 13 may be defined as a coupling line. The RF signal passes through the first transmission line 11 to generate the electromagnetic field nearby. The second transmission line 13 couples with the RF signal of the first transmission line 11 to absorb a part of energy of the RF signal of the first transmission line 11 to generate a coupling signal on the second transmission line 13. Further, the characteristics of the RF signal, such as power of the RF signal, of the first transmission line 11 can be acquired by measuring the coupling signal of the second transmission line 13.

In one embodiment of the invention, the second transmission line 13 is electrically connected to a power detector 17, such as the power detector 17 is connected to the third end 131 of the second transmission line 13. The power detector 17 is able to detect power of the coupling signal of the second transmission line 13, and acquire and/or calculate power of the RF signal of the first transmission line 11. Further, power of the RF signal of the first transmission line 11 can be adjusted according to the measurement result of the power detector 17. The power detector 17 is not a necessary device of the wide band directional coupler 10, and is not limitation of the invention.

In actual application, the wide band directional coupler 10 must meet the SPEC of the power detector 17, such as the coupling factor, the insertion loss, the isolation, and the return loss of the power detector 17. For example, the coupling factor of the SPEC of the power detector 17 may be between −26 dB to −21 dB, and the coupling factor of the second transmission line 13 and the RF signal of the first transmission line 11 must be between −26 dB to −21 dB.

The coupling factor of the second transmission line 13 and the RF signal of the first transmission line 11 depends on the frequency band of the RF signal of the first transmission line 10. For example, as the first transmission line 11 transmits higher frequency RF signal, the coupling factor of the wide band directional coupler 10 will increase. Thus, the coupling factor of the wide band directional coupler 10 may fail the SPEC of the power detector 17, and then the power detector 17 may fail to measure the power of the RF signal of the first transmission line 11 accurately, or the power detector 17 may be overloaded. Thus, the invention discloses a wide band directional coupler 10, wherein the coupling factor and the insertion loss can meet the SPEC of the power detector 17 at various frequency bands.

The coupling factor of the second transmission line 13 and the RF signal of the first transmission line 11 increases with the frequency band of the RF signal transmitted by the first transmission line 11. Thus, the coupling factor of the wide band directional coupler 10 may fail the SPEC of the power detector 17, and the insertion loss of the wide band directional coupler 10 may increase. For example, as the first transmission line 11 transmits the high frequency RF signal, the coupling factor of the second transmission line 13 and the RF signal of the first transmission line 11 will increase. Thus, the second transmission line 13 may absorb more energy of the RF signal of the first transmission line 11 to lead to the energy loss of the RF signal of the first transmission line 11 may exceed the SPEC of the power detector 17.

In this embodiment of the invention, the second transmission line 13 comprises at least one inductor 15, wherein the inductor 15 is connected with the second transmission line 13 in series. For example, the second transmission line 13 comprises a third end 131 and a fourth end 133, wherein one end of the inductor 15 is electrically connected to the third end 131, and the other end of the inductor 15 is electrically connected to the fourth end 133.

The frequency of the coupling signal of the second transmission line 13 increases with the frequency of the RF signal of the first transmission line 11 to lead to increase of the impedance of the inductor 15 on the second transmission line 13. Further, the coupling signal of the second transmission line 13 and the coupling factor of the wide band directional coupler 10 will reduce accordingly. Thus, the insertion loss of the wide band directional coupler 10 at high frequency band can be reduce by reducing the coupling factor of the wide band directional coupler 10 at high frequency.

As mentioned previously, at least one inductor 15 is disposed on the second transmission line 13, and thus the coupling factor and the insertion loss of the wide band directional coupler 10 are able to meet the SPEC of the power detector 17 at high frequency band. In actual application, the inductance of the inductor 15 can be adjusted to modulate the coupling factor and the insertion loss of the wide band directional coupler 10. The inductance of the inductor 15 is only the preferred embodiment of the present invention, and not used for limiting the scope of the present invention.

In other embodiment of the invention, the second transmission line 13 may comprise at least one resistor 19. For example, the third end 131 of the second transmission line 13 is connected to the power detector 17, and the fourth end 133 of the second transmission lien 13 is connected to the resistor 19. The resistor 19 is only the preferred embodiment of the present invention, and not used for limiting the scope of the present invention.

As mentioned by prior art, the wide band directional coupler 10 is able to be applied in a RF device, and the first transmission line 11 may be electrically connected to an antenna. In one embodiment of the invention, the wide band directional coupler 10 is integrated into a RF device to be a single chip, such as RF chip or IPD, for detecting power of the RF chip. However, the impedance of the antenna may be changed, as the user touches or closes the antenna. For instance, the wide band directional coupler 10 and the antenna can be disposed within a portable electronic device. As the user takes the portable electronic device, the impedance of the antenna may be changed.

In other word, the impedance of the antenna connected with the wide band directional coupler 10 may vibrate to affect the coupling factor of the wide band directional coupler 10. For instance, the coupling ripple of the wide band directional coupler 10 may increase. Thus, in this embodiment of the invention, the second transmission line 13 may be connected to a resistor 19 for impedance matching of the antenna to reduce the coupling ripple. In actual application, the resistor 19 may be integrated within the wide band directional coupler 10, and thus the resistor 19 and the wide band directional coupler 10 can be integrated to be a single chip. In other embodiment, the resistor 19 may be provided outside the wide band directional coupler 10. For instance, the resistor 19 may be disposed on a circuit board to be electrically connected to the second transmission line 13 of the wide band directional coupler 10.

In one embodiment of the invention, as the RF signal passes through the first transmission line 11, mutual inductances and/or mutual capacitance may be present between the first transmission line 11 and the second transmission line 13. Further, the rate of mutual inductances and/or mutual capacitance between the first transmission line 11 and the second transmission line 13 can be adjusted base on the shape of the first transmission line 11 and/or the second transmission line 13 to improve the coupling factor and/or the coupling ripple causing by the vibration of impedance of the antenna. For instance, the first transmission line 11 and the second transmission line 13 may be a finger capacitor or stack capacitor.

Figure 2:
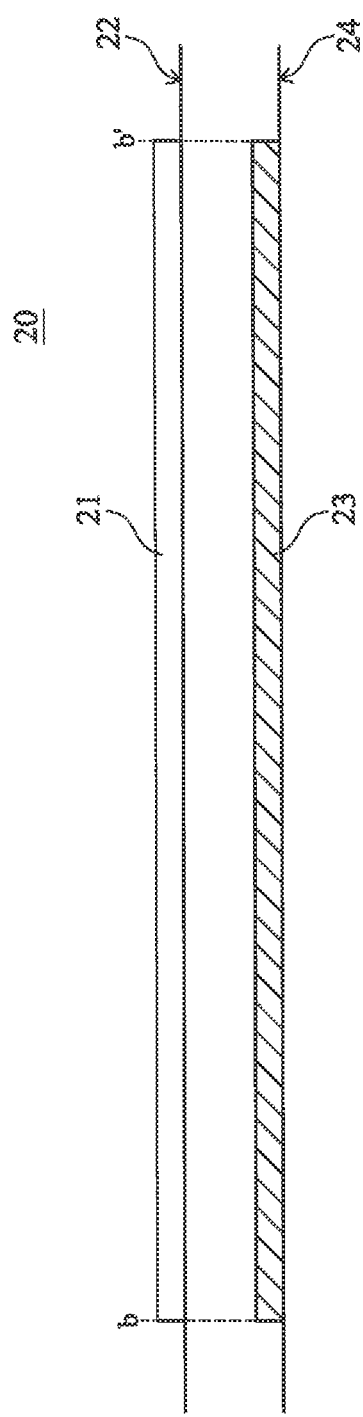
FIG. 2 is a cross section diagram of a wide band directional coupler according to the second embodiment of the present invention.
Figure 3:
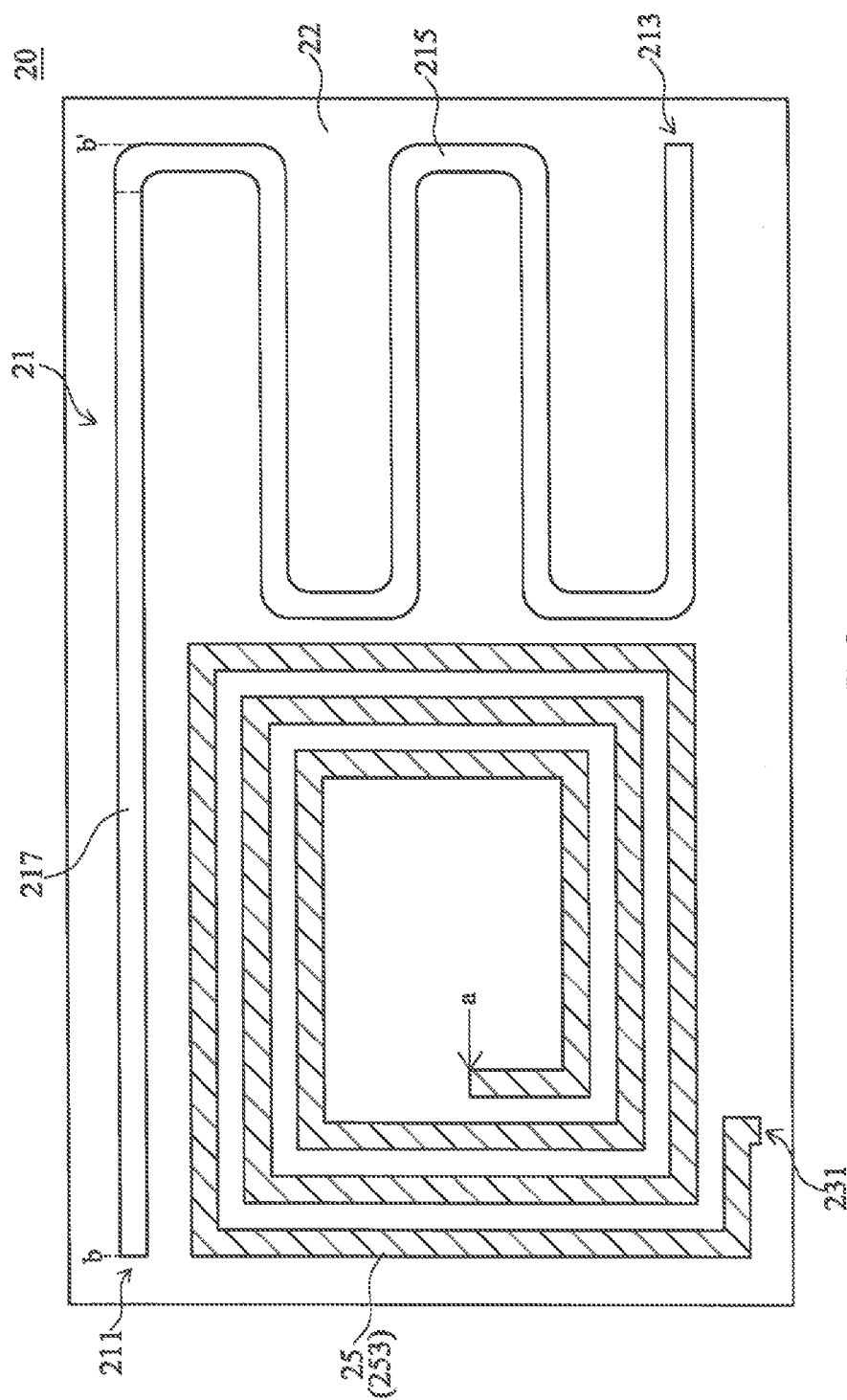
FIG. 3 is a top view diagram of a first layer structure of the wide band directional coupler according to the second embodiment of the present invention.
Figure 4:
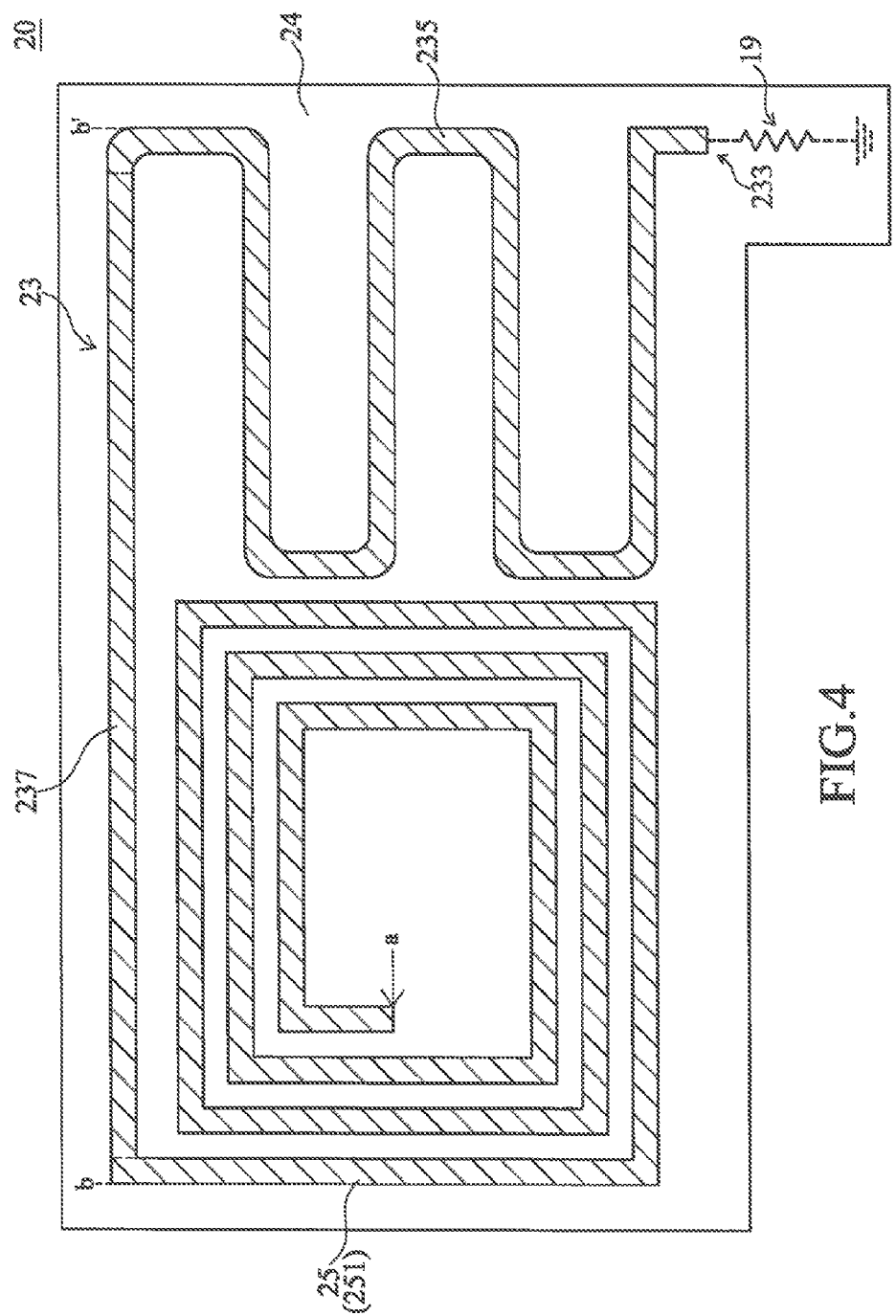
FIG. 4 is a top view diagram of a second layer structure of the wide band directional coupler according to the second embodiment of the present invention.

FIG. 2 shows a cross section diagram of a wide band directional coupler according to the second embodiment of the present invention. FIG. 3 shows a top view diagram of a first layer structure of the wide band directional coupler according to the second embodiment of the present invention. FIG. 4 shows a top view diagram of a second layer structure of the wide band directional coupler according to the second embodiment of the present invention.

The wide band directional coupler 20 comprises a first transmission line 21, a second transmission line 23, at least one inductor 25, a first supporting unit 22 and a second supporting unit 24, wherein the first supporting unit 22 overlaps the second supporting unit 24. The first transmission line 21 is disposed on the first supporting unit 22, and a part of the second transmission line 23 is disposed on the second supporting unit 24. Further, the first transmission line 21 overlaps a part of the second transmission line 23 to result in coupling between the first transmission line 21 and the second transmission line 23.

In one embodiment of the invention, the first transmission line 21 comprises a first part 215 and a second part 217, wherein the first part 215 is connected to the second part 217, and the first part 215 and the second part 217 are disposed on the first supporting unit 22. The shape of the first part 215 may be "S" shape, and the second part 217 may be a straight line or a curve. The second transmission line 23 comprises a third part 235 and a fourth part 237, wherein the third part 235 is connected to the fourth part 237, and the third part 235 and the fourth part 237 are disposed on the second supporting unit 24. The shape of the third part 235 may be "S" shape, and the fourth part 23 may be a straight line or a curve. The first part 215 of the first transmission line 21 and the third part 235 of the second transmission line 23 are "S" shape to reduce size of the wide band directional coupler 20.

The shape and size of the first part 215 and the second part 217 of the first transmission line 21 are similar to the third part 235 and the fourth part 237 of the second transmission line 23 respectively. Further, the first part 215 and the second part 217 of the first transmission line 21 overlap the third part 235 and the fourth part 237 of the second transmission line 23 respectively to result in coupling between the first transmission line 21 and the second transmission line 23.

The inductor 25 may be a spiral, a polygon spiral, an "8" shape spiral or a square spiral. The coupling factor and the insertion loss of the wide band directional coupler 20 at high frequency band can be reduced by disposing the inductor 25 on the second transmission line 23.

In one embodiment of the invention, the inductor 25 may comprise a fifth part 251 and a sixth part 253. The sixth part 253 is disposed on the first supporting unit 22, as shown in FIG. 3. The fifth part 251 is disposed on the second supporting unit 24, as shown in FIG. 4. Further, the fifth part 251 and the sixth part 253 are the spiral, or the square spiral. The sixth part 253 on the first supporting unit 22 and the fifth part 251 on the second supporting unit 24 are connected each other. For instance, the fifth part 251 is connected to the sixth part 253 via the point "a" of the FIG. 3 and FIG. 4. The fifth part 251 overlaps the sixth part 253 to form a multi-lays inductor 25 to reduce the size of the wide band directional coupler 20. In actual application, the inductor 25 may be a single layer or a multi-layers structure.

The first transmission line 21 comprises a first end 211 and a second end 213, and the RF signal is transmitted from the first end 211 to the second end 213. For instance, the second end 213 of the first transmission line 21 is connected to the antenna. During emitting the RF signal, the RF signal is transmitted to the antenna via the first end 211, the first transmission line 21 and the second end 213 in turn. During receiving the RF signal, the antenna transmitting the received RF signal to the first end 211 via the second end 213 and the first transmission line 21 in turn.

The second transmission line 23 comprises a third end 231 and a fourth end 233, wherein the third end 231 is connected to power detector 17 of the FIG. 1, and the fourth end 233 is connected to at least one resistor 19. The coupling ripple causing by the vibration of impedance of antenna can be reduced by connecting the resistor 19 to the second transmission line 23. In one embodiment, the resistor 19 may be disposed within the wide band directional coupler 20. In other embodiment, the resistor 19 may be provided outside the wide band directional coupler 20 to be electrically connected to the second transmission line 23 of the wide band directional coupler 20.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:

1. A wide band directional coupler, comprising:
    a first transmission line for transmitting a RF signal and comprising a first end and a second end;
    a second transmission line being adjacent said first transmission line and comprising a third end and a fourth end;
    a first supporting unit and a second supporting unit, said first supporting unit being in overlaying relationship with said second supporting unit, said first transmission line being disposed on said first supporting unit and at least a portion of said second transmission line being disposed on said second supporting unit; and
    at least one inductor electrically connected between said third end and said fourth end, at least a portion of said at least one inductor being disposed on one of said first supporting unit, said second supporting unit, or a combination of said first and second supporting units, wherein responsive to said RF signal passing through said first transmission line, said second transmission line couples with said RF signal of said first transmission line to generate a coupling signal.

2. The wide band directional coupler according to claim 1, wherein said first transmission line comprises a first part and a second part, said first part is connected to said second part, said first part is S shaped, and said second part is a straight line or a curve.

3. The wide band directional coupler according to claim 2, wherein said second transmission line comprises a third part and a fourth part, said third part is connected to said fourth part, said third part is S shaped, and said fourth part is a straight line or a curve.

4. The wide band directional coupler according to claim 3, wherein said first part and said second part of said first transmission line respectively overlap overlay said third part and said fourth part of said second transmission line.

5. The wide band directional coupler according to claim 4, wherein said first part and said second part of said first transmission line are respectively similarly shaped to said third part and said fourth part of said second transmission line respectively.

6. The wide band directional coupler according to claim 3, wherein said at least one inductor is selected from the group consisting of a spiral, a polygon spiral, an 8 shape spiral and a square spiral.

7. The wide band directional coupler according to claim 6, wherein said at least one inductor comprises a fifth part disposed on said second supporting unit and a sixth part disposed on said first supporting unit, and said fifth part is connected to said sixth part.

8. The wide band directional coupler according to claim 3, wherein said first part and said second part of said first transmission line are disposed on said first supporting unit, and said third part and said fourth part of said second transmission line are disposed on said second supporting unit.

9. The wide band directional coupler according to claim 1, wherein said first transmission line overlays said second transmission line.

* * * * *